(12) United States Patent
Nakagoshi et al.

(10) Patent No.: US 9,414,513 B2
(45) Date of Patent: Aug. 9, 2016

(54) ELECTRONIC COMPONENT MODULE

(71) Applicant: Murata Manufacturing Co., Ltd., Kyoto (JP)

(72) Inventors: Hideo Nakagoshi, Kyoto (JP); Yoichi Takagi, Kyoto (JP); Nobuaki Ogawa, Kyoto (JP); Hidekiyo Takaoka, Kyoto (JP); Kosuke Nakono, Kyoto (JP); Akihiko Kamada, Kyoto (JP); Masaaki Mizushiro, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/576,452

(22) Filed: Dec. 19, 2014

(65) Prior Publication Data

US 2015/0103495 A1    Apr. 16, 2015

Related U.S. Application Data

(63) Continuation of application No. PCT/JP2013/062811, filed on May 7, 2013.

(30) Foreign Application Priority Data

Jun. 22, 2012 (JP) ................................. 2012-140820

(51) Int. Cl.
*H05K 1/18* (2006.01)
*H05K 7/02* (2006.01)
(Continued)

(52) U.S. Cl.
CPC ............ *H05K 7/02* (2013.01); *H01L 23/49811* (2013.01); *H01L 25/16* (2013.01);
(Continued)

(58) Field of Classification Search
USPC ................. 361/761–763, 770–790, 795, 803; 174/259–268, 350–355, 520–523; 257/723–730, 778–790
See application file for complete search history.

(56) References Cited

U.S. PATENT DOCUMENTS 7,450,395 B2 * 11/2008 Sakai ...................... H01L 23/24
257/737
8,558,379 B2 * 10/2013 Kwon ............... H01L 23/49816
257/737

(Continued)

FOREIGN PATENT DOCUMENTS

JP    05-136144 A    6/1993
JP    05-136201 A    6/1993

(Continued)

OTHER PUBLICATIONS

International Search Report issued in Application No. PCT/JP2013/062811 dated Jun. 18, 2013.

(Continued)

*Primary Examiner* — Tuan T Dinh
(74) *Attorney, Agent, or Firm* — Pearne & Gordon LLP

(57) ABSTRACT

A plating layer of a Cu-M-based alloy (M represents Ni and/or Mn) is formed on an end surface of a connection terminal member at an exposed side, the Cu-M-based alloy being capable of generating an intermetallic compound with an Sn-based low-melting-point metal contained in a bonding material forming a bonding portion and having a lattice constant different from that of the intermetallic compound by 50% or more. In the reflow process, even if the bonding material is about to flow out by re-melting thereof, since the bonding material is brought into contact with the Cu-M-based plating layer, a high-melting-point alloy of the intermetallic compound is formed so as to block the interface between the connection terminal member and the resin layer.

19 Claims, 6 Drawing Sheets

(51) Int. Cl.
*H01L 23/498* (2006.01)
*H01L 25/16* (2006.01)
*H05K 1/14* (2006.01)
*H05K 3/36* (2006.01)
*H05K 3/40* (2006.01)
*H01L 23/15* (2006.01)
*H05K 3/28* (2006.01)

(52) U.S. Cl.
CPC ............... *H05K 1/141* (2013.01); *H05K 1/186* (2013.01); *H05K 3/368* (2013.01); *H05K 3/4015* (2013.01); *H01L 23/15* (2013.01); *H01L 23/49822* (2013.01); *H01L 2224/16225* (2013.01); *H01L 2924/1531* (2013.01); *H01L 2924/19106* (2013.01); *H05K 3/284* (2013.01); *H05K 2201/0367* (2013.01); *H05K 2201/10318* (2013.01); *H05K 2201/10477* (2013.01); *H05K 2201/10977* (2013.01); *H05K 2201/10992* (2013.01); *H05K 2203/047* (2013.01)

(56) References Cited

U.S. PATENT DOCUMENTS

| | | | |
|---|---|---|---|
| 8,604,348 B2 * | 12/2013 | Kubota | H01L 23/13 174/255 |
| 2003/0189260 A1 * | 10/2003 | Tong | H01L 24/10 257/778 |
| 2007/0230153 A1 | 10/2007 | Tanida | |
| 2011/0182039 A1 * | 7/2011 | Kato | H01L 23/645 361/736 |
| 2012/0176751 A1 * | 7/2012 | Sakai | H01Q 1/38 361/746 |

FOREIGN PATENT DOCUMENTS

| | | |
|---|---|---|
| JP | 2008-016729 A | 1/2008 |
| JP | 2011-035155 A | 2/2011 |
| WO | 2006/057097 A1 | 6/2006 |
| WO | 2012/066795 A1 | 5/2012 |

OTHER PUBLICATIONS

Written Opinion issued in Application No. PCT/JP2013/062811 dated Jun. 18, 2013.

* cited by examiner ns Ni and/or Mn) is arranged at least at the periphery of an end portion of the connection terminal member at a second end surface side so as to block the interface between the connection terminal member and the resin layer at the second end surface side of the connection terminal member.

ELECTRONIC COMPONENT MODULE

BACKGROUND OF THE INVENTION

1. Field of the Invention

The present invention relates to an electronic component module, and in particular, in an electronic component module which includes a wiring board; electronic components and columnar connection terminal members, which are mounted on the wiring board; and a resin layer sealing the electronic components and the connection terminal members, the present invention relates to the structure of a peripheral portion of the connection terminal member.

2. Description of the Related Art

A technique of interest to the present invention has been disclosed, for example, in Japanese Unexamined Patent Application Publication No. 2008-16729 (Patent Document 1). The Patent Document 1 has disclosed a semiconductor device in which internal connection electrodes each functioning as a columnar connection terminal member are bonded to connection-electrode metal pad port ions disposed at predetermined positions on a wiring pattern of an organic substrate, and in which the internal connection electrodes are sealed with a sealing resin. In addition, the Patent Document 1 has also disclosed that the internal connection electrodes may be solder-bonded to the respective connection-electrode metal pad portions.

However, when the internal connection electrode is connected with a solder, in a reflow process which is performed when a semiconductor device is mounted on a mounting substrate, the volume of the solder used as a bonding material is increased by re-melting thereof, and as a result, a problem in that the solder flows or flushes out of the semiconductor device through a space formed between the internal connection electrode and the sealing resin may arise in some cases.

Patent Document 1: Japanese Unexamined Patent Application Publication No. 2008-16729

BRIEF SUMMARY OF THE INVENTION

Accordingly, an object of the present invention is, in an electronic component module such as the above semiconductor device, to suppress the outflow of a bonding material in a reflow process which is performed when the electronic component module is mounted on a mounting substrate.

The feature of the present invention is, in short, to inhibit the outflow of a bonding material in a reflow process at an exposed end portion of a connection terminal member.

In more particular, an electronic component module of the present invention comprises: a wiring substrate having a first and a second primary surface facing each other; an electronic component mounted at least on the first primary surface of the wiring substrate; a conductive land formed at least on the first primary surface of the wiring substrate; a columnar connection terminal member which has a first and a second end surface facing each other, which is arranged so that the first end surface faces the conductive land, and which is bonded thereto with a bonding portion interposed there between; and a resin layer formed on the first primary surface of the wiring substrate so as to seal the electronic component and the connection terminal member while the second end surface of the connection terminal member is exposed. In this electronic component module, the bonding portion contains a low-melting-point metal which is an Sn element or an alloy containing at least 70 percent by weight of Sn.

In order to overcome the problem described above, the present invention includes the following two aspects.

According to a first aspect, a high-melting-point alloy formed of an intermetallic compound generated from a low-melting-point metal and a Cu-M-based alloy (M represents Ni and/or Mn) is arranged at least at the periphery of an end portion of the connection terminal member at a second end surface side so as to block the interface between the connection terminal member and the resin layer at the second end surface side of the connection terminal member.

According to the structure described above, in a reflow process performed to mount the electronic component module on a mounting substrate, even if a bonding material forming the bonding portion is re-melted, since a so-called "lid" is already formed by the high-melting-point alloy formed of the intermetallic compound, the bonding material can be suppressed from flowing out of the electronic component module.

When the cross section of the above high-melting-point alloy is analyzed by a wavelength-dispersive X-ray spectrometer (WDX), at the cross section of the high-melting-point alloy, at least a Cu—Sn-based, an M-Sn-based, and a Cu-M-Sn-based intermetallic alloy are present, and in addition, when the cross section of the high-melting-point alloy is equally divided into 10 sections along a longitudinal direction and 10 sections along a lateral direction to form 100 squares in total, the rate (hereinafter referred to as "degree of dispersion" in some cases) of the number of squares in each of which at least two types of intermetallic compounds having different constituent elements are present with respect to the remaining total number of squares obtained by excluding the number of squares in each of which an Sn-based metal component is only present is 70% or more.

According to the above preferred structure, since at least three types of intermetallic compounds, such as a Cu—Sn-based, an M-Sn-based, and a Cu-M-Sn-based intermetallic compound, are present at the cross section of the high-melting-point, alloy, and the intermetallic compounds in the high-melting-point alloy are preferably dispersed so as to have a degree of dispersion of 70% or more, stress concentration is not likely to occur. Hence, even if a stress is applied to the high-melting-point alloy due to strain caused by the difference in coefficient of linear thermal expansion generated by heat shock or the like, cracks are not likely to be generated.

The high-melting-point alloy preferably contains no Sn-based metal component, and even if the Sn-based metal component is contained, the content thereof is preferably controlled to 30 percent by volume or less. Since the Sn-based metal component is liable to flow out by re-melting thereof when placed, for example, under a high temperature environment at 300° C. or more, the reliability of a so-called "lid" function by the high-melting-point alloy is liable to be degraded. Hence, when the content of the Sn-based metal component is set to 30 percent by volume or less, the degradation in heat resistance can be suppressed.

The high-melting-point alloy is preferably arranged so as to cover the entire end portion of the connection terminal member at the second end surface side. The reasons for this are that the reliability of the so-called "lid" function can be improved, and at the same time, the problem of solder leaching of the connection terminal member can be further reduced.

According to a second aspect, at least the periphery of the end portion of the connection terminal member at the second end surface side is formed of a Cu-M-based alloy (M represents Ni and/or Mn) which can generate an intermetallic compound with a low-melting-point metal and which has a lattice constant different from that of the intermetallic compound by 50% or more.

According to the structure described above, in a reflow process performed to mount the electronic component module on a mounting substrate, when the bonding material forming the bonding portion is about to flow out by re-melting thereof through the space formed between the resin layer and the connection terminal member, the bonding material is brought into contact with the Cu-M-based alloy and is allowed to react therewith in a relatively short time to generate the intermetallic compound. Hence, the space between the resin layer and the connection terminal member is blocked, and the bonding material is suppressed from flowing out of the electronic component module.

The low-melting-point metal contained in the bonding portion is preferably an Sn element or an alloy containing at least 85 percent by weight of Sn. The reason for this is that the intermetallic compound can be more easily formed between the low-melting-point metal and the Cu-M-based alloy.

In addition, the low-melting-point metal is preferably an Sn element or an alloy containing Sn and at least one element selected from the group consisting of Cu, Ni, Ag, Au, Sb, Zn, Bi, In, Ge, Al, Co, Mn, Fe, Cr, Mg, Mn, Pd, Si, Sr, Te, and P. When having the composition as described above, the low-melting-point metal can easily form the intermetallic compound with the Cu-M-based alloy.

In order to form the intermetallic compound with an Sn-based low-melting-point metal at a lower temperature for a shorter time, the content of M in the Cu-M-based alloy is set to preferably 5 to 30 percent by weight and more preferably 10 to 15 percent by weight.

In addition, since the intermetallic compound can be more reliably obtained, the entire surface of the end portion of the connection terminal member at the second end surface side is preferably formed of the Cu-M-based alloy.

In both the first and the second aspects, the connection terminal member may be formed of a Cu-M-based alloy which can generate the intermetallic compound with the low-melting-point metal and which has a lattice constant different from that of the intermetallic compound by 50% or more. Alternatively, the connection terminal member may be provided with a plating film formed on a surface thereof, and the plating film may be formed of a Cu-M-based alloy which can generate the intermetallic metal with the low-melting-point metal and which has a lattice constant different from that of the intermetallic compound by 50% or more.

According to the structure described above, over the entire surface of the connection terminal member, the intermetallic compound can be generated by the contact between the Cu-M-based alloy and the bonding material forming the bonding portion. Hence, the reliability of preventing the outflow of the boning material from the electronic component module can be further improved.

In addition, in both the first and the second aspects, an electronic component may be further mounted on the second primary surface of the wiring substrate. In particular, in the case of the second aspect, in a reflow process performed to mount an electronic component on the second primary surface, when the bonding material forming the bonding portion is about to flow out by re-melting thereof through the space between the resin layer and the connection terminal member, the bonding material is brought into contact with the Cu-M-based alloy and is allowed to react, therewith to generate the intermetallic compound. Hence, there is obtained the electronic component module according to the first aspect in which the high-melting-point alloy is arranged at least at the periphery of the end portion of the connection terminal member at the second end surface side.

According to the present invention, in a backend process or a reflow process to be performed at a user site, even if the bonding material forming the bonding portion is about to flow or flush out through the space between the resin layer and the connection terminal member by the volume expansion of the bonding material due to re-melting thereof, this problem can be effectively suppressed.

That is, according to the first aspect, even if the bonding material forming the bonding portion is about to flow out by re-melting thereof through the space between the resin layer and the connection terminal member, since the high-melting-point alloy formed of the intermetallic compound is arranged as the so-called "lid" so as to block the interface between the connection terminal member and the resin layer, the outflow of the bonding material from the electronic component module can be suppressed.

On the other hand, according to the second aspect, even if the bonding material forming the bonding portion is about, to flow out by re-melting thereof through the space between the resin layer and the connection terminal member, a reaction generating the intermetallic compounds, such as a Cu—Sn-based, an M-Sn-based, and a Cu-M-Sn-based intermetallic compound, is performed within a relatively short time when the bonding material is brought into contact with the Cu-M-based alloy. Accordingly, since the high-melting-point alloy functioning as the so-called "lid" is arranged at the periphery of the end portion of the connection terminal portion at the second end surface side, the problem in that the bonding material flows or flushes out can be made difficult to occur.

DETAILED DESCRIPTION OF THE INVENTION

Figure 1:
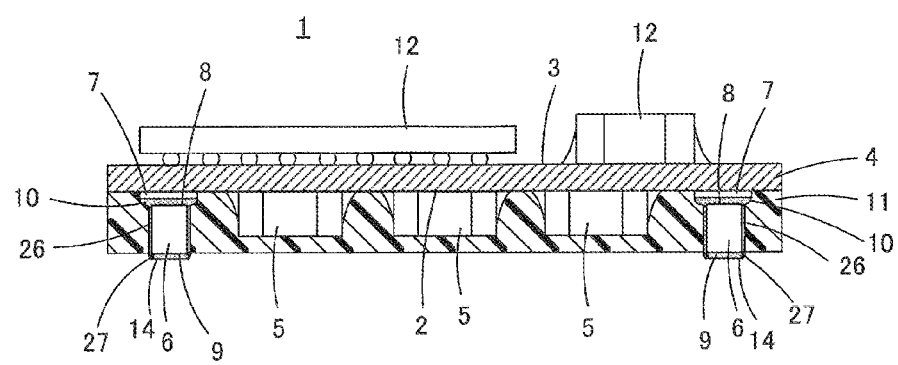
FIG. 1 is a cross-sectional view of an electronic component module 1 according to a first embodiment of the present invention.

With reference to FIG. 1, an electronic component module 1 according to a first embodiment of the present invention will be described. The first embodiment corresponds to the first aspect described above.

The electronic component module 1 includes a wiring substrate 4 having a first primary surface 2 and a second primary surface 3 facing each other. The wiring substrate 4 is formed of a multilayer ceramic substrate which is manufactured by laminating ceramic green sheets, followed by firing thereof. The ceramic green sheets are each formed from a slurry in which a powdered mixture containing alumina, a glass, and the like, which are used as raw materials for a low-temperature sinterable ceramic, is mixed together with an organic binder, a solvent, and the like. Via holes are formed in the ceramic green sheets by laser processing or the like, and a conductive paste containing Ag, Cu, and/or the like is filled in the via holes thus formed, so that via conductors for interlayer connection are formed. In addition, various electrode patterns are formed on the ceramic green sheets by printing a conductive paste thereon.

Subsequently, the ceramic green sheets are laminated and pressure-bonded to each other to form a ceramic laminate, and firing is then performed at a relatively low temperature, such as approximately 1,000° C., so that the wiring substrate 4 is obtained. In the wiring substrate 4 thus obtained, although not shown in FIG. 1, wiring conductors including via conductors and internal electrode patterns are provided.

In addition, besides the case in which a multilayer ceramic substrate including ceramic layers formed of a low-temperature sinterable ceramic material as described above is used as the wiring substrate 4, the wiring substrate 4 may be an alumina-based substrate, a glass substrate, a composite material substrate, or a printed circuit board using a resin or a polymer material or also may be a monolayer substrate, and in accordance with the purpose of use of the electronic component module 1, an optimum material or structure may be appropriately selected.

On the first primary surface 2 of the wiring substrate 4, a plurality of electronic components 5, such as a chip component and an IC, are mounted. In addition, on the first primary surface 2, a plurality of columnar connection terminal members 6 are also mounted. In FIG. 1, conductive lands 7 mounting the connection terminal members 6 are shown. The conductive lands 7 are formed on the first primary surface 2 of the wiring substrate 4. The columnar connection terminal member 6 has a first end surface 8 and a second end surface 9 facing each other, and the first end surface 8 is arranged to face the conductive land 7 and is also bonded thereto with a bonding portion 10 interposed there between. In addition, the details of the structure relating to the connection terminal member 6 will be described later with reference to FIGS. 3 and 4.

The electronic component module 1 includes a resin layer 11 formed on the first primary surface 2 of the wiring substrate 4 so as to seal the electronic components 5 and the connection terminal members 6 while the second end surfaces 3 thereof are exposed. In FIG. 1, although the top surfaces of the electronic components 5 are also covered with the resin layer 11, the electronic components 5 may be sealed while the top surfaces thereof are exposed.

The electronic, component module 1 further includes a plurality of electronic components 12, such as a chip component and an IC, mounted on the second primary surface 3 of the wiring substrate 4.

Next, with reference to FIGS. 2A to 2D, a method for manufacturing the electronic component module 1 will be described. In addition, in FIGS. 2A to 2D, the electronic component module 1 shown in FIG. 1 is shown upside down.

First, the wiring substrate 4 is formed by the method as described above, and next, as shown in FIG. 2A, the electronic components 5 and the connection terminal members 6 are mounted on the first primary surface 2 of the wiring substrate 4 using a bonding material. In this step, although the bonding material forming the bonding portion 10 is an Sn element or a low-melting-point metal which is an alloy containing at least 70 percent by weight of Sn, the details of the bonding material will be described later.

Figure 2:
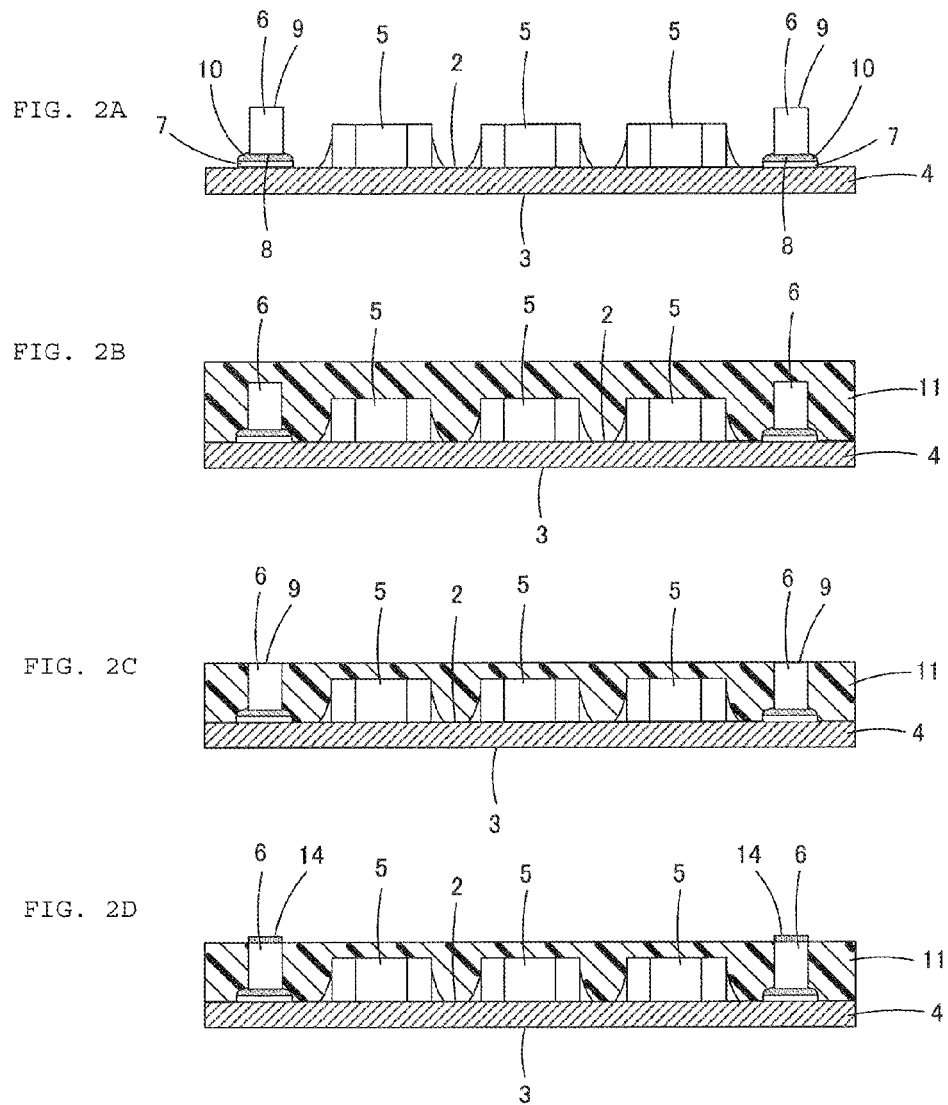
FIGS. 2A-2D include cross-sectional views sequentially showing steps performed to manufacture the electronic component module 1 shown in FIG. 1.

Next, as shown in FIG. 2B, the resin layer 11 is formed on the first primary surface 2 of the wiring substrate 4 so as to seal the electronic components 5 and the connection terminal members 6. The resin layer 11 may be formed, for example, from a composite resin in which an inorganic filler, such as aluminum oxide, silica (silicon dioxide), or titanium dioxide, is mixed with a thermosetting resin, such as an epoxy resin, a phenol resin, or a cyanate resin.

For example, when the resin layer 11 is formed using a semi-cured resin sheet obtained by molding a composite resin on a PET film, after the wiring substrate 4 provided with a spacer or a mold having a predetermined thickness along the periphery thereof is covered with a resin sheet, the resin sheet is heat-pressed so that the resin thickness becomes equivalent to the thickness of the spacer or the mold. Subsequently, the resin is cured by heating the wiring substrate 4 in an oven, so that the resin layer 11 can be formed to have a desired thickness.

In addition, the resin layer 11 may also be formed using another general molding technique capable of forming a resin layer, such as a potting technique using a liquid resin, a transfer molding technique, or a compression molding technique.

Next, as shown in FIG. 2C, since the surface of the resin layer 11 is ground and/or polished by a roller blade or the like to remove an unnecessary resin, the surface of the resin layer 11 is planarized, and at the same time, the second end surfaces 9 of the connection terminal members 6 are exposed to the surface of the resin layer 11. In addition, although not shown in the drawing, in this step, grinding and/or polishing may also be performed so as to expose the top surfaces of the electronic components 5. In addition, when the electronic component 5 is an IC, the top surface thereof may also be ground and/or polished. Accordingly, the height of the electronic component module 1 can be further reduced.

In the case in which the heights of the connection terminal members 6 from the first primary surface 2 of the wiring substrate 4 vary each other, for example, due to the influence of variation in thickness of the bonding portion 10 formed at a first end surface 8 side of the connection terminal member 6, when the connection terminal members 6 at a second end surface 9 side are ground and/or polished together with the resin layer 11, the heights of the connection terminal members 6 from the wiring substrate 4 can be made flush with each other.

In the step shown in FIG. 2B, when the resin layer 11 is formed so as to appropriately expose the second end surfaces 9 of the connection terminal members 6, the step of grinding and/or polishing the surface of the resin layer 11 may not be always required.

Next, as shown in FIG. 2D, a plating film 14 is formed on the exposed second end surface 9 of the connection terminal member 6. The details of the step shown in FIG. 2D are shown in FIG. 3.

The connection terminal member 6 is formed, for example, from Cu. The connection terminal member 6 has desired cross-sectional and longitudinal dimensions and is obtained by cutting a metal wire having a circular or a polygonal cross-sectional shape to have a predetermined length.

Figure 3:
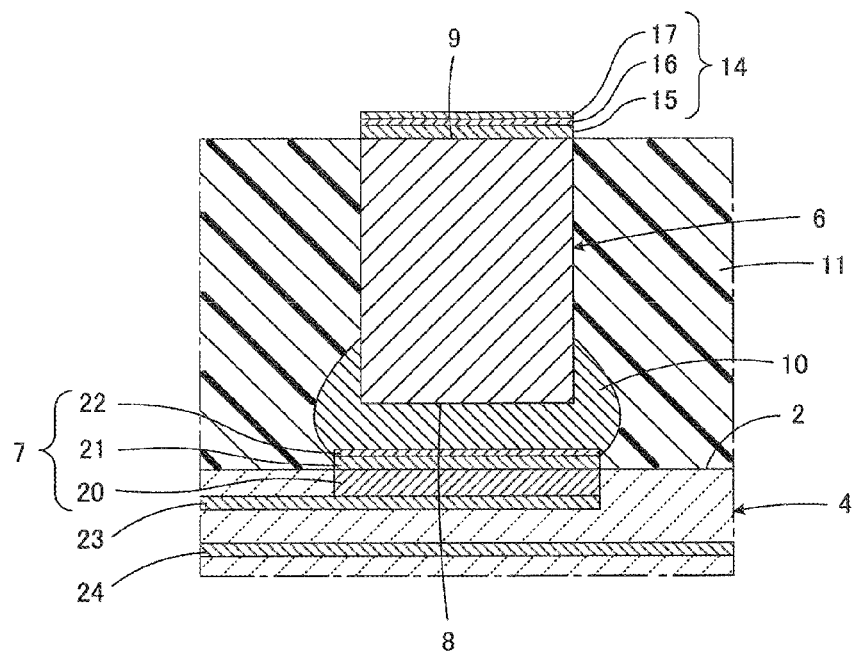
FIG. 3 is an enlarged cross-sectional view showing a portion at which a connection terminal member 6 is located to illustrate the details of the step shown in FIG. 2D.

As shown in FIG. 3, the plating film 14 is composed of a Cu-M-based plating layer 15 of a Cu-M-based alloy (M represents Ni and/or Mn), a Ni plating layer 16 formed thereon, and an Au plating layer 17 formed on the plating layer 16. By the above Cu-M-based plating layer 15, the state in which at least the periphery of the end portion of the connection terminal member 6 at the second end surface 9 side is formed of a Cu-M-based alloy is obtained.

In FIG. 3, a partially enlarged view of the wiring substrate 4 is also shown.

In FIG. 3, although the conductive land 7 provided for the wiring substrata 4 is shown, in this embodiment, the conductive land 7 is composed of a Cu thick layer 20 formed by firing a conductive paste containing Cu, a Ni plating layer 21 formed thereon, and an Au plating layer 22 formed on the Ni plating layer 21. In addition. FIG. 3 also shows internal electrode patterns 23 and 24 formed in the wiring substrate 4. The internal electrode pattern 23 is electrically connected to the above conductive land 7.

The bonding material used for forming the bonding portion 10 in the above step shown in FIG. 2A is a material formed by dispersing a powdered low-melting-point metal in a flux.

As the above low-melting-point metal, an Sn element or an alloy containing at least 70 percent by weight of Sn may be used.

The above flux functions to remove oxide films on the surfaces of the connection terminal member 6 and the conductive land 7, each of which is an object to be bonded, and the surface of the powdered metal contained in the bonding material. However, the bonding material is not always required to contain a flux, and a bonding method which requires no flux may also be used. For example, by a method in which heating is performed while the pressure is applied or a method in which heating is performed in a strong reducing atmosphere, the oxide films on the surface of the object to be bonded and that of the powdered metal are also removed, so that highly reliable bonding can be achieved. In addition, when the flux is contained, the content thereof with respect to the total bonding material is preferably 7 to 15 percent by weight.

As the flux, a known flux containing a vehicle, a solvent, a thixotropic agent, an activator, and/or the like may be used.

As particular examples of the vehicle, for example, there may be mentioned a rosin-based resin formed from rosin or a derivative thereof such as a modified rosin, a synthetic resin, or a mixture thereof. As particular examples of the rosin-based resin formed from rosin or a derivative thereof such as a modified rosin, a gum rosin, a tall rosin, a wood rosin, a polymerized rosin, a hydrogenated rosin, a formylated rosin, a rosin ester, a rosin-modified maleic resin, a rosin-modified phenol resin, a rosin-modified alkyd resin, and other various types of rosin derivatives may be mentioned by way of example. As particular examples of the synthetic resin, a polyester resin, a polyamide resin, a phenoxy resin, and a terpene resin may be mentioned by way of example.

In addition, as the solvent, for example, an alcohol, a ketone, an ester, an ether, an aromatic compound, and a hydrocarbon have been known, and as particular examples, benzyl alcohol, ethanol, isopropyl alcohol, butanol, diethylene glycol, ethylene glycol, glycerol, ethyl cellosolve, butyl cellosolve, ethyl acetate, butyl acetate, butyl benzoate, diethyl adipate, dodecane, tetradecene, α-terpineol, terpineol, 2-methyl 2,4-pentanediol, 2-ethylhexanediol, toluene, xylene, propylene glycol monophenyl ether, diethylene glycol monohexyl ether, ethylene glycol monobutyl ether, diethylene glycol monobutyl ether, diisobutyl adipate, hexylene glycol, cyclohexane dimethanol, 2-terpinyl oxyethanol, 2-dihydroterpinyl oxyethanol, and a mixture thereof may be mentioned by way of example.

In addition, as particular examples of the thixotropic agent, a hydrogenated castor oil, a carnauba wax, an amide, a hydroxy fatty acid, dibensylidene sorbitol, a bis(p-methylibenzylidene)sorbitol, a bees wax, an amide stearate, and ethylenebisamide hydroxystearate may be mentioned by way of example. In addition, for example, a compound obtained, if necessary, by addition of a fatty acid, such as caprylic acid, lauric acid, myristic acid, palmitic acid, stearic acid, or behenic acid; a hydroxy fatty acid such as 1,2-hydroxy stearic acid; an antioxidant; a surfactant; and/or an amine to the aforementioned compound may also be used as the thixotropic agent.

In addition, as the activator, for example, a hydrohalogenic acid salt of an amine, an organic halogenated compound, an organic acid, an organic amine, and a polyalcohol may be mentioned.

As particular examples of the hydrohalogenic acid salt of an amine functioning as the activator, for example, there may be mentioned diphenylguanidine hydrobromide, diphenylguanidine hydrochloride, cyclohexylamine hydrobromide, ethylamine hydrochloride, ethylamine hydrobromide, diethylaniline hydrobromide, diethylaniline hydrochloride, triethanolamine hydrobromide, and monoethanolamine hydrobromide.

As particular examples of the organic halogenated compound functioning as the activator, for example, there may be mentioned a chloroparaffin, a tetrabromoethane, a dibromopropanol, 2,3-dibromo-1,4-butanediol, 2,3-dibromo-2-butene-1,4-diol, and tris(2,3-dibromopropyl)isocyanurate.

In addition, as particular examples of the organic acid functioning as the activator, for example, there may be mentioned malonic acid, fumaric acid, glycolic acid, citric acid, malic acid, succinic acid, phenylsuccinic acid, maleic acid, salicylic acid, anthranilic acid, glutaric acid, suberic acid, adipic acid, sebacic acid, stearic acid, abietic acid, benzoic acid, trimellitic acid, pyromellitic acid, and dodecanoic acid, and in addition, as particular examples of the organic amine, for example, there may be mentioned monoethanolamine, diethanolamine, triethanolamine, tributylamine, aniline, and diethylaniline.

In addition, as the polyalcohol functioning as the activator, for example, erythritol, pyrogallol, and ribitol may be mentioned.

In addition, as flux, there may be used a compound containing at least one thermosetting resin selected from the group consisting of an epoxy resin, a phenol resin, a polyimide resin, a silicone resin or a modified resin thereof, and an acrylic resin or at least one thermoplastic resin selected from the group consisting of a polyamide resin, a polystyrene resin, a polymethacrylic resin, a polycarbonate resin, and a cellulose-based resin.

In addition, the bonding material forming the bonding portion 10 may also be, for example, in a solid state in the form of a plate instead of being in the above paste state.

Figure 4:
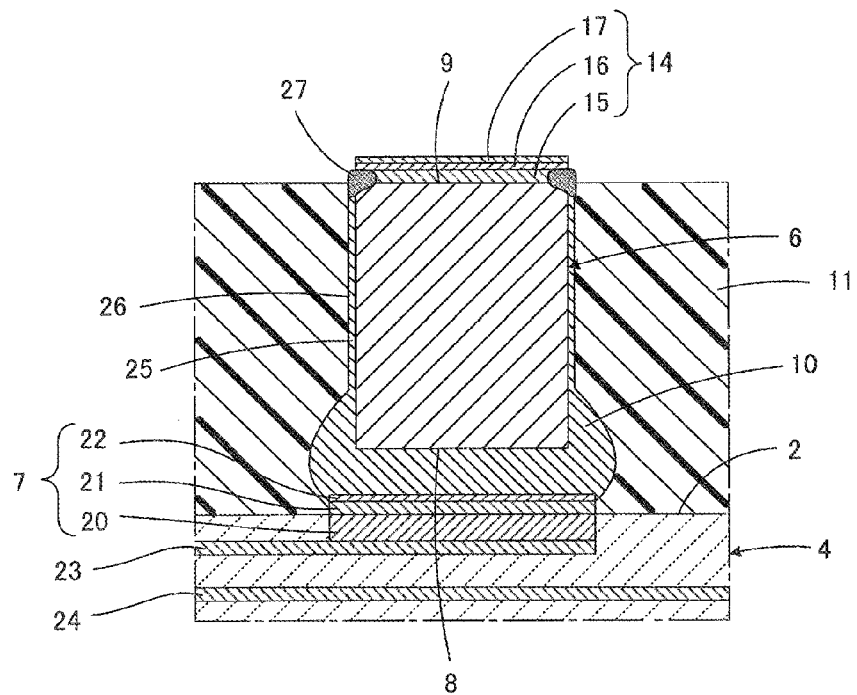
FIG. 4 is a view corresponding to that shown in FIG. 3 and showing the state obtained by a reflow process performed after the step shown in FIG. 3.

After the above step shown in FIGS. 2D and 3, as shown in FIG. 1, a step of mounting the electronic components 12 on the second primary surface 3 of the wiring substrate 4 is performed. In this step, a reflow process is applied. After the reflow process, the state as shown in FIG. 4 is obtained.

By a heat treatment performed in the above reflow process, the bonding material forming the bonding portion 10 may be re-melted in some cases. The re-melting of the bonding material causes the volume expansion thereof, and as a result, as shown in FIG. 4, a molten bonding material 25 is about to flow out through a space 26 formed between the connection terminal member 6 and the resin layer 11. In this step, the molten bonding material 25 is brought into contact with the above Cu-M-based plating layer 15 at the second end surface 9 side of the connection terminal member 6, and within several seconds to several tens of seconds from the start of the contact described above, an intermetallic compound having a high melting point is generated between the Sn-based low-melting-point metal contained in the bonding material 25 and the Cu-M-based alloy. As a result, at least at the periphery of the end portion of the connection terminal member 6 at the second end surface 9 side, a high-melting-point alloy 21 is formed from the above intermetallic compound, and this high-melting-point alloy 27 blocks the interface between the connection terminal member 6 and the resin layer 11 at the second end surface 9 side of the connection terminal member 6.

As described above, the electronic component module 1 is completed.

According to the high-melting-point alloy 27 described above, in the reflow process performed to mount the electronic component module 1 on a mounting substrate (not shown), even if the bonding material forming the bonding portion 10 is re-melted, since a so-called "lid" is already formed by the high-melting-point alloy 27, the bonding material can be suppressed from flowing out of the electronic component module 1.

When the cross section of the above high-melting-point alloy 27 is analyzed by a wavelength-dispersive x-ray spectrometer (WDX), at least a Cu—Sn-based, an M-Sn-based, and a Cu-M-Sn-based intermetallic compound are preferably present at the cross section of this high-melting-point alloy 27, and in addition, when the cross section of the high-melting-point alloy 27 is equally divided into 10 sections along a longitudinal direction and 10 sections along a lateral direction to form 100 squares in total, the rate (the degree of dispersion) of the number of squares in each of which at least two types of intermetallic compounds having different constituent elements are present with respect, to the remaining total number of squares obtained by excluding the number of squares in each of which an Sn-based metal component is only present, that is, with respect to the total number of squares in each of which at least one intermetallic compound is present, is preferably 70% or more.

In other words, the above "remaining squares obtained by excluding the squares in each of which an Sn-based metal is only present" indicates the squares in each of which at least one intermetallic compound is present.

In addition, the above "intermetallic compounds having different constituent elements" indicate intermetallic compounds, such as a Cu—Mn—Sn intermetallic compound and a Cu—Sn intermetallic compound, having a specific relationship therebetween. For example, since $Cu_6Sn_5$ and $Cu_3Sn$ are formed from the same constituent elements (that is, Cu and Sn), those compounds are regarded as one type of compound. In addition, the above "at least two types" indicate not only the above three types of Cu—Sn-based, M-Sn-based, and Cu-M-Sn-based intermetallic compounds but also indicate at least two types of intermetallic compounds including at least one intermetallic compound (such as a Ag—Sn-based intermetallic compound) besides at least one of the above three types of intermetallic compounds.

As described above, when at least three types of intermetallic compounds, such as a Cu—Sn-based, an M-S-based, and a Cu-M-Sn-based intermetallic compound, are present in the high-melting-point alloy 27, and in addition, when the intermetallic compounds in the high-melting-point alloy 27 are in a preferable dispersion state having a degree of dispersion of 70% or more, since stress concentration is not likely to occur, even if a stress is applied to the periphery of the connection terminal member 6 due to strain caused by the difference in coefficient of linear thermal expansion which is generated by a heat shock or the like, cracks are not likely to be generated.

In order to improve the reliability of the so-called "lid" function by the high-melting-point alloy 27, the high-melting-point alloy 27 preferably contains no Sn-based metal component, and even in the case in which the Sn-based metal component is contained, the content thereof is preferably controlled to 30 percent by volume or less. The reason for this is that when being disposed, for example, in a high temperature environment at a temperature of 300° C. or more, the Sn-based metal component may flow out in some cases by re-melting thereof, and the heat resistance of the high-melting-point alloy 27 is degraded thereby.

In addition, in FIG. 4, although the high-melting-point alloy 27 is arranged only at the periphery of the end portion of the connection terminal member 6 at the second end surface 9 side, the high-melting-point alloy 27 is preferably arranged so as to cover the entire end portion of the connection terminal member 6 at the second end surface 9 side. The reasons for this are that the reliability of the so-called "lid" function by the high-melting-point alloy 27 can be improved and, in addition, the problem of solder leaching of the connection terminal member 6 can be further suppressed. In order to arrange the high-melting-point alloy 27 to cover the entire end portion of the connection terminal member 6 at the second end surface 9 side as described above, for example, the temperature of a heat treatment performed to generate the high-melting-point alloy 27 may be increased, and the time for the heat treatment may also be increased. Accordingly, the reaction between the Sn component contained in the bonding material 25 and the Cu-M-based alloy forming the Cu-M-based plating layer 15 continues, and hence the Cu-M-based plating layer 15 can be all converted into the high-melting-point alloy 27.

In the first embodiment described above, the reflow process performed to mount the electronic components 12 on the second primary surface 3 of the wiring substrate 4 is used to generate the high-melting-point alloy 27. However, the present invention may also be applied to the case in which no electronic components 12 are mounted on the second primary surface 3 of the wiring substrate 4. Hence, in this case, a heat treatment exclusively used to generate the high-melting-point alloy 27 may be performed.

Figure 5:
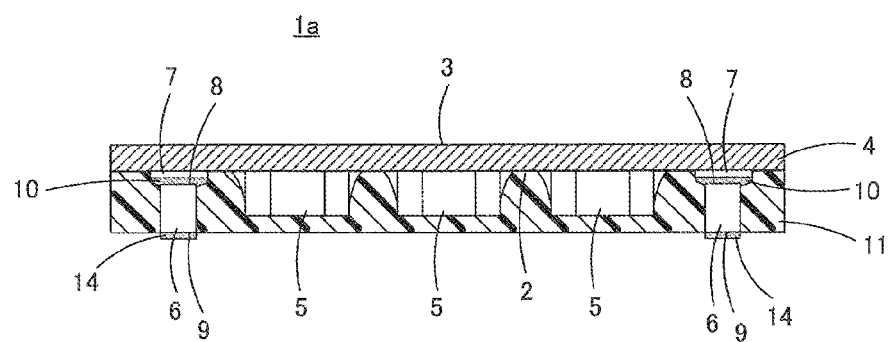
FIG. 5 is a cross-sectional view showing an electronic component module 1a according to a second embodiment of the present invention.

Next, a second embodiment of the present invention will be described primarily with reference to FIG. 5. The second embodiment corresponds to the second aspect described above.

An electronic component module 1a of the second embodiment is substantially the same as an intermediate product obtained in a process for manufacturing the electronic component module 1 according to the above first embodiment, that is, an intermediate product at the stage after the step shown in FIGS. 2D and 3 is completed. Hence, in FIG. 5, an element corresponding to the element shown in FIG. 2D is designated by the same reference numeral, and duplicated description will be omitted. In addition, the second embodiment will be described also with reference to FIG. 3.

In the electronic component module 1a of the second embodiment, at least the periphery of the end portion of the connection terminal member 6 at the second end surface 9 side is formed of a Cu-M-based alloy which can generate an intermetallic compound with an Sn-based low-melting-point alloy contained in the bonding portion 10 and which has a lattice constant different from that of the intermetallic compound by 50% or more. In the embodiment shown in the drawing, by the Cu-M-based plating layer 15 included in the plating film 14 formed on the second end surface 9 of the connection terminal member 6, the above Cu-M-based alloy is obtained.

Although the bonding portion 10 contains an Sn element or a low-melting-point metal containing at least 70 percent by weight of Sn as in the case of the first embodiment, in this second embodiment, in particular, as the low-melting-point metal, an alloy containing at least 85 percent by weight of Sn is preferably used. In addition, as the low-melting-point metal, for example, an Sn element or an alloy containing Sn and at least one element selected from the group consisting of Cu, Ni, Ag, Au, Sb, Zn, Bi, In, Ge, Al, Co, Mn, Fe, Cr, Mg, Mn, Pd, Si, Sr, Te, and P may be preferably mentioned. When the low-melting-point metal has a preferable composition as described above, an intermetallic compound can be easily generated with the Cu-M-based alloy forming the Cu-M-based plating layer 15.

In addition, the Cu-M-based alloy forming the Cu-M-based plating layer 15 is able to generate intermetallic compounds, such as a Cu—Sn-based, an M-Sn-based, or a Cu-M-Sn-based intermetallic compound, having a melting point of 310° C. or more in combination with the above Sn-based low-melting-point metal. When the Cu-M-based alloy is a Cu—Mn-based alloy, the content of Mn in the alloy is preferably 10 to 15 percent by weight, and when the Cu-M-based alloy is a Cu—Ni-based alloy, the content of Ni in the alloy is preferably 10 to 15 percent by weight. When the Cu-M-based alloy has the composition as described above, an intermetallic compound can be easily formed with an Sn-based low-melting-point metal at a lower temperature and for a shorter time.

In the Cu-M-based alloy, for example, impurities at a concentration of 1 percent by weight or less may be contained so as not to inhibit the reaction with an Sn-based low-melting-point metal. As the impurities, for example, there may be mentioned Zn, Ge, Ti, Sn, Al, Be, Sb, In, Ga, Si, Ag, Mg, La, P, Pr, Th, Zr, B, Pd, Pt, Ni, and Au.

In addition, as described above, the Cu-M-based alloy is selected so that the difference in lattice constant from that of the intermetallic compound generated with the low-melting-point metal is 50% or more. As shown in the following formula, the difference in lattice constant described above is a value (%) calculated in such a way that after the lattice constant of the Cu-M-based alloy is subtracted from that of the intermetallic compound, the value thus obtained is then divided by the lattice constant of the Cu-M-based alloy, and the absolute value thereof is multiplied by 100 times. That is, this difference in lattice constant indicates the difference in lattice constant of the intermetallic compound first generated at the interface with the Cu-M-based alloy from that of the Cu-M-based alloy, and the magnitude of the lattice constant itself is not discussed here.

The lattice constant is represented by the following formula.

$$\text{Difference in Lattice Constant (\%)} = [|\{(\text{Lattice Constant of Intermetallic Compound}) - (\text{Lattice Constant of Cu-M-Based Alloy})\}|/(\text{Lattice Constant of Cu-M-Based Alloy})] \times 100$$

Figure 6:
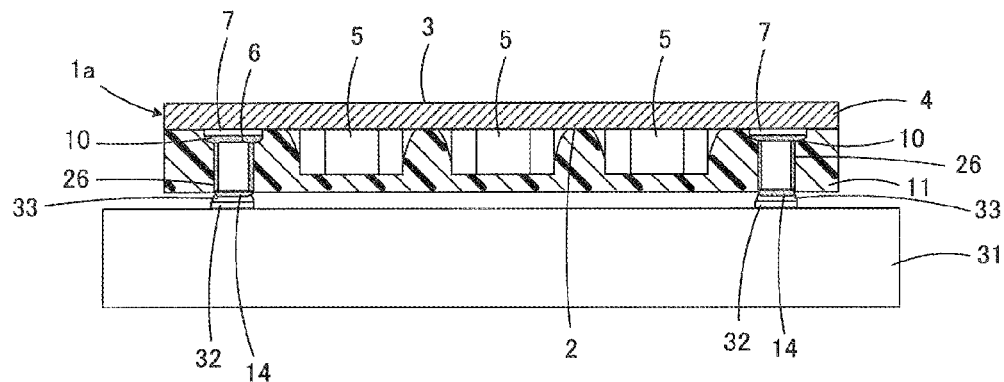
FIG. 6 is a cross-sectional view showing the state in which the electronic component module 1a shown in FIG. 5 is mounted on a mounting substrate 31.
Figure 7:
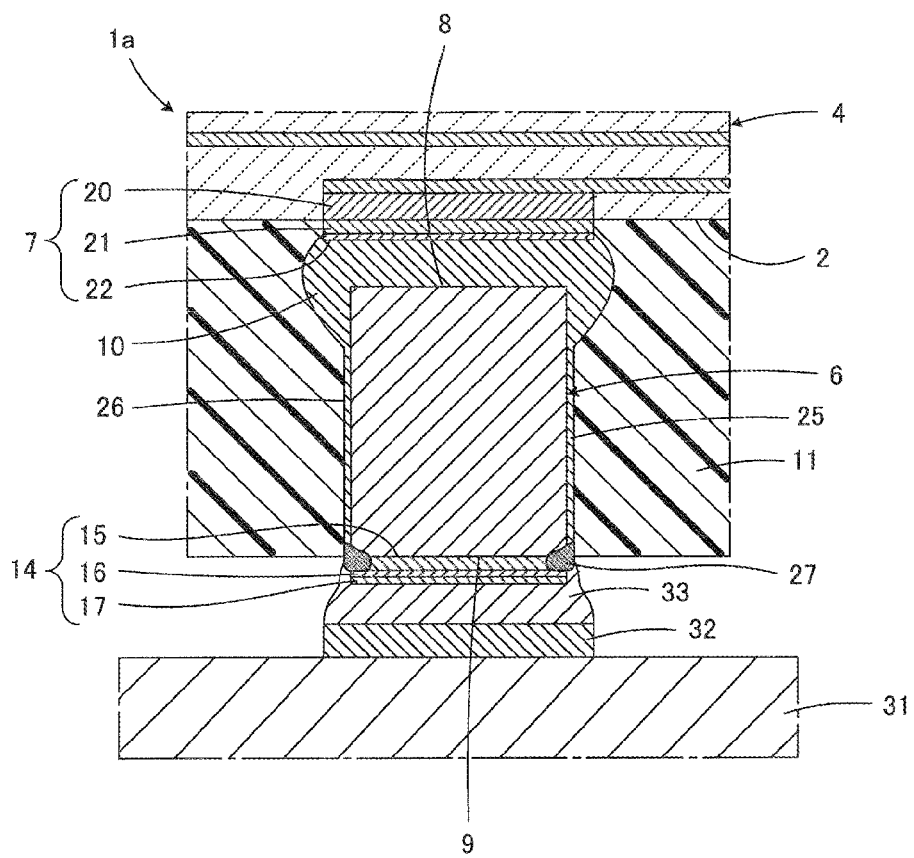
FIG. 7 is an enlarged cross-sectional view showing a portion at which the connection terminal member 6 is located in the electronic component module 1a shown in FIG. 5 to illustrate a phenomenon generated in the mounting step shown in FIG. 6.

As shown in FIG. 6, the electronic component module 1a as the final product described above is mounted on a mounting substrate 31. In FIG. 6, there are shown conductive lands 32 provided on the mounting substrate 31 and bonding portions 33 each bonding the conductive land 32 to the connection terminal member 6 of the electronic component module 1a with the plating film 14 interposed therebetween. The bonding portion 33 is formed, for example, of a solder containing an Sn-based low-melting-point metal, and in order to form the bonding portion 33, a reflow process is used. FIG. 7 is an enlarged view showing the structure of the periphery of the connection terminal member 6 of the electronic component module 1a mounted on the mounting substrate 31.

When the reflow process is performed to mount the electronic component module 1a on the mounting substrata 31, at the periphery of the connection terminal member 6, there occurs a phenomenon substantially similar to that in the above first embodiment which occurs in the reflow process preformed to mount the electronic components 12 on the second primary surface 3 of the wiring substrate 4.

That is, by a heat treatment performed in the above reflow process, since the bonding material forming the bonding portion 10 is re-melted, and the volume thereof is increased, as shown in FIG. 7, the molten bonding material 25 is about to flow out to the outside through the space 26 between the connection terminal member 6 and the resin layer 11. In this step, the molten bonding material 25 is brought into contact with the Cu-M-based plating layer 15 at the second end surface 9 side of the connection terminal member 6, and an intermetallic compound having a high melting point is generated between the Sn-based low-melting-point metal contained in the bonding material 25 and the Cu-M-based alloy within a relatively short time. As a result, the high-melting-point alloy 27 of the above intermetallic compound is formed at least at the periphery of the end port ion of the connection terminal member 5 at the second end surface 9 side so as to block the interface between the connection terminal member 6 and the resin layer 11 at the second end surface 9 side of the connection terminal member 6.

In addition, in the reflow process described above, since a bonding material forming the bonding portion 33 bonded to the mounting substrate 31 is in a molten state, the bonding material forming the bonding portion 33 may partially contribute to the formation of the high-melting-point alloy 27 in some cases.

When the high-melting-point alloy 27 is once formed as described above, even if a bonding material forming the bonding portion 10 which is present in the electronic component module 1a is re-melted thereafter, the bonding material can be suppressed from flowing out of the electronic component module 1a.

Incidentally, in FIG. 7, although the high-melting-point alloy 27 is arrange only at the periphery of the end portion of the connection terminal member 6 at the second end surface 9 side, as pointed out in the description of the first embodiment, the high-melting-point alloy 27 is preferably arranged so as to cover the entire end portion of the connection terminal member 6 at the second end surface 9 side. In order to arrange the high-melting-point alloy 27 so as to cover the entire end portion of the connection terminal member 6 at the second end surface 9 side as described above, for example, the temperature and/or the time of the reflow process performed for mounting on the mounting substrate 31 may be increased.

Figure 8:
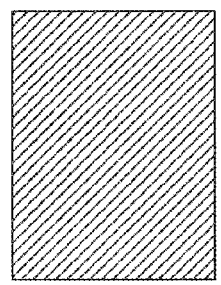
FIG. 8 is a cross-sectional view showing a first modified example of the connection terminal member used in the first and the second embodiments.
Figure 9:
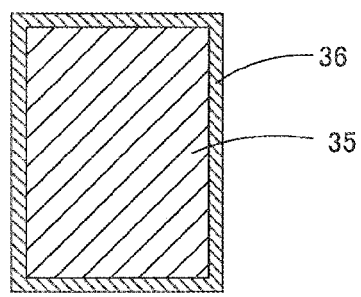
FIG. 9 is a cross-sectional view showing a second modified example of the connection terminal member used in the first and the second embodiments.

The connection terminal member 6 formed from Cu used in the first and the second embodiments may be replaced by a member shown in FIG. 8 or 9. A connection terminal member 6a shown in FIG. 8 is entirely formed from a Cu-M-based alloy. In a connection terminal member 6b shown in FIG. 9, a main body portion 35 is formed from Cu, and the surface thereof is covered with a plating film 36 formed from a Cu-M-based alloy. In the connection terminal members 6a and 6b, as the Cu-M-based alloy, an alloy is used whose lattice constant is different by 50% or more from that of an intermetallic compound which is generated between the alloy and an Sn-based low-melting-point metal contained in the bonding portion 10.

According to the structure as described above, over the entire surface of each of the connection terminal members 6a and 6b, the intermetallic compound can be generated by the contact between the Cu-M-based alloy and the Sn-based low-melting-point metal. Hence, the reliability of preventing the outflow of the bonding material to the outside of the electronic component module can be further enhanced.

In addition, in the first and the second embodiments, the Ni plating layer 16 and the Au plating layer 17 may not be provided for the plating film 14. That is, the plating film 14 may be formed only from the Cu-M-based plating layer 15.

Next, experimental examples based on the present invention will be described.

Experimental Example 1

Figure 10:
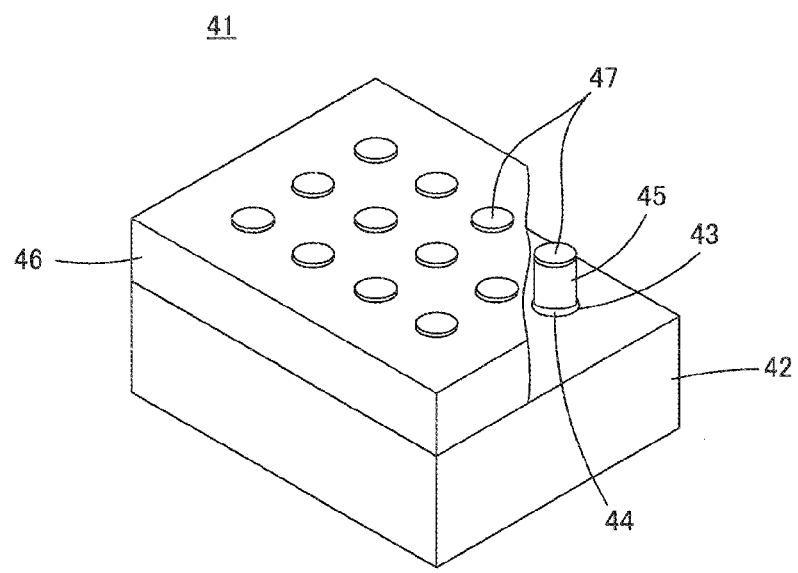
FIG. 10 is a partially cut-off perspective view showing the appearance of a test work 41 formed in an experimental example.

In Experimental Example 1, a test work 41 having the structure as shown in FIG. 10 was formed.

The test work 41 included a wiring substrate 42 formed from a low-temperature sinterable ceramic material; 12 conductive lands 43 which were arranged on one primary surface of the wiring substrate 42 to form a matrix of 3 by 4 and which were formed of Cu processed by Ni plating; 12 connection terminal members 45 which were formed from Cu, which were arranged so that first end surfaces thereof face the respective conductive lands 43, and which were bonded thereto with bonding portions 44 interposed therebetween; and a resin layer 46 which was formed from an epoxy resin and which was provided on the one primary surface of the wiring substrate 42 so as to seal the connection terminal members 45, and plating films 47 were formed on second end surfaces of the connection terminal members 45.

The wiring substrate 42 had a plan dimension of 3 mm by 2.4 mm and a thickness of 1 mm, the connection terminal member 45 had a diameter of 0.3 mm, a length of 0.5 mm, and an arrangement pitch of 0.6 mm, and the resin layer had a thickness of 0.55 mm.

In order to obtain the bonding portion 44 of this test work 41, a bonding material in the form of paste was prepared by mixing a flux and a powder formed from a low-melting-point metal shown in the column of "Low-Melting-Point. Metal Forming Bonding Material" shown in Table 1. As the flux, a mixture containing 74 percent by weight of a rosin, 22 percent by weight of diethyleneglycol monobutyl ether, 2 percent by weight of triethanolamine, and 2 percent by weight of a hydrogenated castor oil was used. In addition, the mixing rate of the flux was set to 10 percent by weight of the entire bonding material.

Next, after the wiring substrate 42 was prepared, and the bonding material described above was applied on the conductive lands 43 to have a thickness of 0.05 mm, the connection terminal members 45 were arranged thereon.

Subsequently, by performing a heat treatment using a reflow apparatus in accordance with a temperature profile in which a temperature of 150° C. to 180° C., a temperature of 220° C. or more, and a temperature of 240° C. or more were maintained for 90, 40, and 15 seconds, respectively, and in which the peak temperature was set to 235° C. to 245° C., the conductive lands 43 were bonded to the connection terminal members 45, so that the bonding portions 44 were formed.

Next, the resin layer 46 was formed on the one primary surface of the wiring substrate 42 so as to seal the connection terminal members 45.

Subsequently, the plating films 47 were formed on the second end surfaces of the connection terminal members 45. This plating film 47 was formed from "Composition" described in the column of "Plating Film on Second End Surface of Connection Terminal Member" shown in Table 1. In the column of the "Plating Film on Second End Surface of Connection Terminal Member", "Lattice Constant" based on the a-axis is also shown.

After a pre-treatment was performed on the test work 41 thus obtained at a temperature of 125° C. for 24 hours, the test work 41 was left stand still for 168 hours under high-temperature and high-humidity conditions at a temperature of 85° C. and a relative humidity of 85% and was then heat-treated three times under reflow conditions at a peak temperature of 260° C.

Subsequently, "First Generated Intermetallic Compound" shown in Table 1 was evaluated. The "First Generated Intermetallic Compound" indicates an intermetallic compound first generated at the interface between the plating film 47 on the second end surface of the connection terminal member 45 and the bonding material which was melted by the above heat treatment and was about to flow out. The intermetallic compound described above was confirmed by performing a mapping analysis on the cross section of the above interface portion using a FE-WDX. The "Lattice Constant" was obtained using the a-axis as the base. In addition, "Difference in Lattice Constant" in Table 1 was obtained by the formula described above.

In addition, in Table 1, representative examples of the intermetallic compound generated at the interface port ion between the plating film 47 on the second end surface of the connection terminal member 45 and the molten bonding material are shown in the column of "Example of Intermetallic Compound Generated at Second End Surface Side of Connection Terminal Member". Hence, an intermetallic compound other than those shown in Table 1 may also be generated at the second end surface side of the connection terminal member 45. The intermetallic compound generated at the second side surface side of the connection terminal member 45 was also confirmed by a mapping analysis performed on the cross section thereof using a FE-WDX.

In addition, as shown in Table 1, "Degree of Dispersion" was evaluated. The "Degree of Dispersion" was obtained by the following procedure.

(1) In a cross-sectional photo of the interface portion between the plating film 47 on the second end surface of the connection terminal member 45 and the molten bonding material, the interface portion was equally divided into 10 sections along a longitudinal direction and 10 sections along a lateral direction to form 100 squares in total.

(2) The number of squares in each of which at least two types of intermetallic compounds were present was counted.

(3) If there were squares in each of which no intermetallic compound was present, the number of the squares thereof was subtracted from the 100 squares thus finely divided, and the number of squares obtained by this subtraction was regarded as the total number of squares. Subsequently, the number of squares in each of which at least two types of intermetallic compounds were present obtained in the above (2) was divided by the total number of squares and was then multiplied by 100, so that, the degree of dispersion (%) was obtained.

In addition, as shown in Table 1, "Outflow Test" was performed on the test work 41 after the above heat treatment was performed. In the "Outflow Test," by the appearance observation of the test work 41, whether the bonding material flowed out between the connection terminal member 45 and the resin layer 46 or not was evaluated. When no outflow was confirmed at all the connection terminal members 45, it was evaluated as OK, and "○" was shown in the column of the "Outflow Test," and when the outflow was confirmed at at least one connection terminal member 45, it was evaluated as NG, and "x" was shown in the column of the "Outflow Test."

"Example of Intermetallic Compound Generated at Second End Surface Side of Connection Terminal Member," and the "Degree of Dispersion" were also the same as those of Sample 2, and in the "Outflow Test," this sample was also evaluated as "○."

On the other hand, in the "Outflow Test," Samples 16 to 18 which are out of the range of the present invention were evaluated as "x." The reasons for this are estimated as follows, That is, in Samples 16 and 17, as for the "Example of Inter-

TABLE 1

| Sample No. | Low-Melting-Point Metal Forming Bonding Material | Plating Film on Second End Surface of Connection Terminal Member | | First Generated Intermetallic Compound | | Difference in Lattice Constant (%) | Example of Intermetallic Compound Generated at Second End Surface Side of Connection Terminal Member | Degree of Dispersion | Outflow Test |
|---|---|---|---|---|---|---|---|---|---|
| | | Composition | Lattice Constant a (nm) | Composition | Lattice Constant a (nm) | | | | |
| 1 | Sn—3Ag—0.5Cu | Cn—10Ni | 0.357 | Cu$_2$NiSn | 0.597 | 67 | CuNiSn-based/NiSn-based/CuSn-based/AgSn-based | 85 | ○ |
| 2 | Sn—3Ag—0.5Cu | Cu—10Mn | 0.367 | Cu$_2$MnSn | 0.617 | 68 | CuMnSn-based/MnSn-based/CuSn-based/AgSn-based | 100 | ○ |
| 3 | Sn | Cu—10Mn | 0.367 | Cu$_2$MnSn | 0.617 | 68 | CuMnSn-based/MnSn-based/CuSn-based | 100 | ○ |
| 4 | Sn—3.5Ag | Cu—10Mn | 0.367 | Cu$_2$MnSn | 0.617 | 68 | CuMnSn-based/MnSn-based/CuSn-based/AgSn-based | 100 | ○ |
| 5 | Sn—0.75Cu | Cu—10Mn | 0.367 | Cu$_2$MnSn | 0.617 | 68 | CuMnSn-based/MnSn-based/CuSn-based | 100 | ○ |
| 6 | Sn—15Bi | Cu—10Mn | 0.367 | Cu$_2$MnSn | 0.617 | | CuMnSn-based/MnSn-based/CuSn-based | 100 | ○ |
| 7 | Sn—0.7Cu—0.05Ni | Cu—10Mn | 0.367 | Cu$_2$MnSn | 0.617 | 68 | CuMnSn-based/MnSn-based/CuSn-based/AgSn-based | 100 | ○ |
| 8 | Sn—5Sb | Cu—10Mn | 0.367 | Cu$_2$MnSn | 0.617 | 68 | CuMnSn-based/MnSn-based/CuSn-based/AgSn-based | 100 | ○ |
| 9 | Sn—2Ag—0.5Cu—2Bi | Cu—10Mn | 0.367 | Cu$_2$MnSn | 0.617 | 68 | CuMnSn-based/MnSn-based/CuSn-based/AgSn-based | 100 | ○ |
| 10 | Sn—30Bi | Cu—10Mn | 0.367 | Cu$_2$MnSn | 0.617 | 68 | CuMnSn-based/MnSn-based/CuSn-based | 78 | ○ |
| 11 | Sn—3.5Ag—0.5Bi—8In | Cu—10Mn | 0.367 | Cu$_2$MnSn | 0.617 | 68 | CuMnSn-based/MnSn-based/CuSn-based/AgSn-based | 100 | ○ |
| 12 | Sn—9Zn | Cu—10Mn | 0.367 | Cu$_2$MnSn | 0.617 | 68 | CuMnSn-based/MnSn-based/CuSn-based | 100 | ○ |
| 13 | Sn—8Zn—3Bi | Cu—10Mn | 0.367 | Cu$_2$MnSn | 0.617 | | CuMnSn-based/MnSn-based/CuSn-based | 100 | ○ |
| 14 | Sn—Mg—0.5Cu | Cu—12Mn—4Ni | 0.367 | Cu$_2$MnSn | 0.617 | 68 | CuMnSn-based/MnSn-based/CuSn-based/AgSn-based | 100 | ○ |
| 15 | Sn—3Ag—0.5Cu | Cu—10Mn—1P | 0.367 | Cu$_2$MnSn | 0.617 | 68 | CuMnSn-based/MnSn-based/CuSn-based/AgSn-based | 100 | ○ |
| 16 | Sn—3Ag—0.5Cu | Cu | 0.361 | Cu$_3$Sn | 0.432 | 20 | CuSn-based/AgSn-based | 10 | x |
| 17 | Sn—3Ag—0.5Cu | Cu—10Zn | 0.359 | Cu$_3$Sn | 0.432 | 20 | CuSn-based/AgSn-based | 16 | x |
| 18 | Sn—40Bi | Cu—10Mn | 0.367 | Cu$_3$Sn | 0.432 | 20 | CuMnSn-based/MnSn-based/CuSn-based | 55 | x |

In Table 1, Samples 16 to 18 are Comparative Examples which are out of the range of the present invention.

In Samples 1 to 15 which are within the range of the present invention, as apparent from the "Example of Intermetallic Compound Generated at Second End Surface Side of Connection Terminal Member," at least a Cu—Sn-based, an M-Sn-based (M represents Ni and/or Mn), and a Cu-M-Sn-based intermetallic compound were present, and as the "Degree of Dispersion," a value of 70% or more was obtained.

As a result, in the "Outflow Test," Samples 1 to 15 were evaluated as "○".

In addition, although not shown in Table 1, evaluation similar to that described above was performed on a sample in which as the "Low-Melting-Point Metal Forming Bonding Material," the same material as that of Sample 2 was used, the connection terminal member 45 itself was formed from "Cu-10Mn," and the plating film 47 was not formed. As a result, by this sample thus prepared, the "First Generated Intermetallic Compound," the "Difference in Lattice Constant," the metallic Compound Generated at Second End Surface Side of Connection Terminal Member," the condition in which at least a Cu—Sn-based, an M-Sn-based, and a Cu-M-Sn-based intermetallic compound were present was not satisfied, and in Samples 16 to 18, the "Difference In Lattice Constant" was small, such as 20%, and the "Degree of Dispersion" was less than 70%.

Experimental Example 2

Experimental Example 2 was performed to obtain a preferable content of M of the Cu-M-based alloy forming the plating film on the second end surface of the connection terminal member.

First, as the bonding material, a compound containing "Sn" as shown in the column of "Low-Melting-Point Metal Forming Bonding Material" of Table 2, that is, the same compound as that used for Sample 3 in Experimental Example 1, was prepared.

On the other hand, as the plating film 47 on the second end surface of the connection terminal member 45, compounds having the compositions shown in the column of "Plating Film on Second End Surface of Connection Terminal Member" of Table 2 were prepared.

Next, under conditions similar to those of Experimental Example 1, a test work 41 was formed. As shown in Table 2, "Residual Percentage of Low-Melting-Point Metal" of the interface portion between the bonding material of the test work 41 thus obtained and the plating film 47 was evaluated. For the evaluation of the "Residual Percentage of Low-Melting-Point. Metal," after approximately 7 mg was cut away from the above interface portion of the sample thus obtained, a differential scanning calorimeter measurement (DSC measurement) thereof was performed using $Al_2O_3$ as a reference at a measurement temperature of 30° C. to 300° C. and a temperature rise rate of 5° C./min in a $N_2$ atmosphere. From an endothermic amount of a melting endothermic peak at a melting temperature of Sn in the obtained DSC chart, the residual amount of an Sn component was quantitatively determined. In addition, from this Sn component amount, the rate of the Sn component with respect to the total metal component was obtained as the "Residual Percentage of Low-Melting-Point Metal."

TABLE 2

| Sample No. | Low-Melting-Point Metal Forming Bonding Material | Plating Film on Second End Surface of Connection Terminal Member | Residual Percentage of Low-Melting-Point Metal (Vol %) |
| --- | --- | --- | --- |
| 31 | Sn | Cu—5Mn | 19 |
| 32 | Sn | Cu—10Mn | 0 |
| 33 | Sn | Cu—15Mn | 0 |
| 34 | Sn | Cu—20Mn | 9 |
| 35 | Sn | Cu—30Mn | 21 |
| 36 | Sn | Cu—5Ni | 12 |
| 37 | Sn | Cu—10Ni | 0 |
| 38 | Sn | Cu—15Ni | 0 |
| 39 | Sn | Cu—20Ni | 5 |

From Table 2, it was found that although when the content of M of the Cu-M (M represents Mn or Ni) alloy forming the plating film 47 was 5 to 30 percent by weight, the residual Sn component was decreased to some extent, when the content of M was 10 to 15 percent by weight, the residual Sn component was further decreased. From the results described above, it was found that in order to easily form the metallic compound between the Cu-M-based alloy and the Sn-based low-melting-point metal at a lower temperature and for a shorter time, the content of M of the Cu-M-based alloy was set to preferably 5 to 30 percent by weight and more preferably 10 to 15 percent by weight.

REFERENCE SIGNS LIST 1, 1a electronic component module
2 first primary surface
3 second primary surface
4, 42 wiring substrate
5, 12 electronic component
6, 6a, 6b, 45 connection terminal member
7, 43 conductive land
8 first end surface
9 second end surface
10, 44 bonding portion
11, 46 resin layer
14 plating film
15 Cu-M-based plating layer
25 bonding material
27 high-melting-point alloy

The invention claimed is:

1. An electronic component module comprising:
a wiring substrate having a first and a second primary surface facing each other;
an electronic component mounted at least on the first primary surface of the wiring substrate;
a conductive land formed at least on the first primary surface of the wiring substrate;
a columnar connection terminal member which has a first and a second end surface facing each other, which is arranged so that the first end surface faces the conductive land, and which is bonded thereto with a bonding portion interposed therebetween; and
a resin layer formed on the first primary surface of the wiring substrate so as to seal the electronic component and the connection terminal member while the second end surface of the connection terminal member is exposed,
wherein the bonding portion contains a low-melting-point metal which is an Sn element or an alloy containing at least 70 percent by weight of Sn,
a high-melting-point alloy formed of an intermetallic compound generated by the low-melting-point metal and a Cu-M-based alloy is arranged at least at the periphery of an end portion of the connection terminal member at a second end surface side so as to block the interface between the resin layer and the connection terminal member at the second end surface side of the connection terminal member, and
the M of the Cu-M-based alloy comprises Ni, Mn, or a combination thereof.

2. The electronic component module according to claim 1, wherein when a cross section of the high-melting-point alloy is analyzed by a wavelength-dispersive X-ray spectrometer (WDX), at least a Cu—Sn-based, an M-Sn-based, and a Cu-M-Sn-based intermetallic compound are present at the cross section of the high-melting-point alloy, and
when the cross section of the high-melting-point alloy is equally divided into 10 sections along a longitudinal direction and 10 sections along a lateral direction to form 100 squares in total, a rate of number of squares in each of which at least two types of intermetallic compounds having different constituent elements are present with respect to the remaining total number of squares obtained by excluding the number of squares in each of which an Sn-based metal component is only present is 70% or more.

3. The electronic component module according to claim 1, wherein the high-melting-point alloy contains 30 percent by volume or less of an Sn-based metal component.

4. The electronic component module according to claim 3, wherein the high-melting-point alloy contains no Sn-based metal component.

5. The electronic component module according to claim 1, wherein the high-melting-point alloy is arranged to cover the entire end portion of the connection terminal member at the second end surface side.

6. An electronic component module comprising:
a wiring substrate having a first and a second primary surface facing each other;
an electronic component mounted at least on the first primary surface of the wiring substrate;

a conductive land formed at least on the first primary surface of the wiring substrate;

a columnar connection terminal member which has a first and a second end surface facing each other, which is arranged so that the first end surface faces the conductive land, and which is bonded to the conductive land with a bonding portion interposed therebetween; and a resin layer formed on the first primary surface of the wiring substrate so as to seal the electronic component and the connection terminal member while the second end surface of the connection terminal members is exposed, wherein the bonding portion contains a low-melting-point metal which is an Sn element or an alloy containing at least 70 percent by weight of Sn, at least the periphery of an end portion of the connection terminal member at a second end surface side is formed of a Cu-M-based alloy which generates an intermetallic compound with the low-melting-point metal, and which has a lattice constant different from that of the intermetallic compound by 50% or more, and the M of the Cu-M-based alloy comprises Ni, Mn, or a combination thereof.

7. The electronic component module according to claim 6, wherein the low-melting-point metal includes an Sn element or an alloy containing at least 85 percent by weight of Sn.

8. The electronic component module according to claim 6, wherein the low-melting-point metal includes an Sn element or an alloy containing Sn and at least one element selected from the group consisting of Cu, Ni, Ag, Au, Sb, Zn, Bi, In, Ge, Al, Co, Mn, Fe, Cr, Mg, Mn, Pd, Si, Sr, Te, and P.

9. The electronic component module according to claim 6, wherein the Cu-M-based alloy contains 5 to 30 percent by weight of the M.

10. The electronic component module according to claim 9, wherein the Cu-M-based alloy contains 10 to 15 percent by weight of the M.

11. The electronic component module according to claim 6, wherein the entire surface of the end portion of the connection terminal member at the second end surface side is formed of the Cu-M-based alloy.

12. The electronic component module according to claim 1, wherein the connection terminal member is formed of a Cu-M-based alloy which generates an intermetallic compound with the low-melting-point metal, and which has a lattice constant different from that of the intermetallic compound by 50% or more.

13. The electronic component module according to claim 1, wherein the connection terminal member is provided with a plating film formed on a surface thereof, and the plating film is formed of a Cu-M-based alloy which generates an intermetallic compound with the low-melting-point metal, and which has a lattice constant different from that of the intermetallic compound by 50% or more.

14. The electronic component module according to claim 1, further comprising an electronic component mounted on the second primary surface of the wiring substrate.

15. The electronic component module according to claim 2, wherein the high-melting-point alloy contains 30 percent by volume or less of an Sn-based metal component.

16. The electronic component module according to claim 2, wherein the high-melting-point alloy is arranged to cover the entire end portion of the connection terminal member at the second end surface side.

17. The electronic component module according to claim 3, wherein the high-melting-point alloy is arranged to cover the entire end portion of the connection terminal member at the second end surface side.

18. The electronic component module according to claim 4, wherein the high-melting-point alloy is arranged to cover the entire end portion of the connection terminal member at the second end surface side.

19. The electronic component module according to claim 7, wherein the low-melting-point metal includes an Sn element or an alloy containing Sn and at least one element selected from the group consisting of Cu, Ni, Ag, Au, Sb, Zn, Bi, In, Ge, Al, Co, Mn, Fe, Cr, Mg, Mn, Pd, Si, Sr, Te, and P.

* * * * *